(12) United States Patent
Chen

(10) Patent No.: US 6,453,574 B1
(45) Date of Patent: Sep. 24, 2002

(54) METHOD FOR ALIGNING A CASSETTE POD TO AN OVERHEAD HOIST TRANSPORT SYSTEM

(75) Inventor: Raymond Chen, Hsin-Chi (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/820,129

(22) Filed: Mar. 28, 2001

(51) Int. Cl.⁷ .............................................. G01D 21/00
(52) U.S. Cl. ............................ 33/645; 33/1 LE; 33/391
(58) Field of Search .................................. 33/1 LE, 301, 33/391, 392, 413, 520, 533, 613, 644, 645

(56) References Cited

U.S. PATENT DOCUMENTS

| | | | |
|---|---|---|---|
| 3,603,461 A | * 9/1971 | Best | 211/47 |
| 3,846,917 A | * 11/1974 | Blakey | 33/533 |
| 4,055,899 A | * 11/1977 | Dean | 33/193 |
| 4,561,187 A | * 12/1985 | Powell | 33/288 |
| 5,937,521 A | * 8/1999 | March et al. | 29/897.34 |
| 6,366,830 B2 | * 4/2002 | Bacchi et al. | 414/217 |
| 2002/0000048 A1 | * 1/2002 | Nyen | 33/645 |

* cited by examiner

*Primary Examiner*—Diego Gutierrez
*Assistant Examiner*—Travis Reis
(74) *Attorney, Agent, or Firm*—Tung & Associates

(57) ABSTRACT

A method for aligning a cassette pod on the loadport of a process machine to an overhead hoist transport (OHT) system is disclosed. The method can be carried out by marking a first standard reference line on a clean room floor to which the OHT system is aligned, followed by aligning two plumb bobs at two points that are at least 5 cm apart to the first standard reference line on the floor with tips of the plumb bobs suspended over and positioned juxtaposed to the floor. A second standard reference line is then formed by interconnecting the two plumb bobs at an elevation above a top surface of the cassette pod, followed by aligning a center line of the cassette pod to the second standard reference line. The present invention novel method can therefore be executed utilizing simple mechanical equipment without the need of a sophisticated laser alignment system.

17 Claims, 4 Drawing Sheets

METHOD FOR ALIGNING A CASSETTE POD TO AN OVERHEAD HOIST TRANSPORT SYSTEM

FIELD OF THE INVENTION

The present invention generally relates to a method for aligning a cassette pod positioned on the loadport of a process machine to an overhead hoist transport (OHT) system and more particularly, relates to a method for aligning a cassette pod positioned on the loadport of a process machine to an overhead hoist transport system by using a simple mechanical device of plumb bob without the need of electronic instrumentation.

BACKGROUND OF THE INVENTION

In the manufacturing of a semiconductor device, the device is usually processed at many work stations or processing machines. The transporting or conveying of partially finished devices, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes. For instance, three possible configurations for utilizing a stocker may be provided. In case A, a stocker is utilized for storing WIP wafers in SMIF pods and transporting them first to tool A, then to tool B, and finally to tool C for three separate processing steps to be conducted on the wafers. After the processing in tool C is completed, the SMIF pod is returned to the stocker for possible conveying to another stocker. The configuration in case A is theoretically workable but hardly ever possible in a fabrication environment since the tools or processing equipment cannot always be arranged nearby to accommodate the processing of wafers in the stocker.

In the second configuration, a stocker and a plurality of buffer stations A, B and C are used to accommodate different processes to be conducted in tool A, tool B and tool C. A SMIF pod may be first delivered to buffer station A from the stocker and waits there for processing in tool A. Buffer stations B and C are similarly utilized in connection with tools B and C. The buffer stations A, B and C therefore become holding stations for conducting processes on the wafers. This configuration provides a workable solution to the fabrication process, however, requires excessive floor space because of the additional buffer stations required. The configuration is therefore not feasible for use in a semiconductor fabrication facility.

In the third configuration, a stocker is provided for controlling the storage and conveying of WIP wafers to tools A, B and C. After a SMIF pod is delivered to one of the three tools, the SMIF pod is always returned to the stocker before it is sent to the next processing tool. This is a viable process since only one stocker is required for handling three different processing tools and that no buffer station is needed. This configuration illustrates that the frequency of use of the stocker is extremely high since the stocker itself is used as a buffer station for all three tools. The accessing of the stocker is therefore more frequent than that required in the previous two configurations.

FIG. 1 illustrates a schematic of a typical automatic material handling system 20 that utilizes a central corridor 22, a plurality of bays 24 and a multiplicity of process machines 26. A multiplicity of stockers 30 are utilized for providing input/out to bay 24, or to precessing machines 26 located on the bay 24. The central corridor 22 designed for bay lay-out is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation. It has been observed that a major cause for the stockers 30 to be the bottleneck is the input/output ports of the stockers.

In modern semiconductor fabrication facilities, especially for the 200 mm or 300 mm FAB plants, automatic guided vehicles (AGV) and overhead hoist transport (OHT) are extensively used to automate the wafer transport process as much as possible. The AGE and OHT utilize the input/output ports of a stocker to load or unload wafer lots, i.e. normally stored in POUFs. FIG. 2 is a perspective view of an overhead hoist transport system 32 consisting of two vehicles 34,36 that travel on a track 38. An input port 40 and an output port 42 are provided on the stocker 30. As shown in FIG. 2, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Similarly, the OHT system is also used to deliver a cassette pod such as a FOUP to a process machine. This is shown in FIG. 3. A cassette pod 10 of the FOUP type is positioned on a loadport 12 of a process machine 14. The loadport 12 is frequently equipped with a plurality of locating pins 16 for the proper positioning of the cassette pod 10. A detailed perspective view of the FOUP 10 is shown in FIG. 4. The FOUP 10 is constructed of a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of an OHT system (not shown).

When an OHT system is utilized in transporting a cassette pod to a process machine, problems arise when the loadport of the process machine is not in alignment with the OHT system. Mis-positioned cassette pods on a loadport not only affects the operation of loading/unloading wafers from the pod, but also in severely misaligned instances may cause the cassette pod to tip over resulting in the breakage of wafers. Conventionally, a laser surveying instrument is used to align the cassette pod, i.e. the loadport of the process machine, to an OHT system. The laser equipment, even though can be properly used in a pilot plant setup, cannot be used in a fabrication facility for several reasons. First, the laser equipment is costly and difficult to operate. Secondly, laser emission is harmful to human eyes and thus when it is used, disturbs other operators that are working in the same intra-bay. In a production facility, there are frequently 20 or 30 process machines lined up in an intra-bay area. It is therefore extremely difficult to use a laser to align a single machine, while not disturbing the operation of all the other machines.

In a modern fabrication facility for processing the 300 mm wafers, the OHT system is the most popularly used cassette transport system. It is therefore very important to be able to align all the cassette pods, or the loadports of the process machine, in a straight line in the same OHT intra-bay to assure the integrity of the fabrication process. In order to minimize the effect on the fabrication yield, the laser alignment equipment cannot be used in the facility for the alignment of a single process machine.

It is therefore an object of the present invention to provide a method for aligning a cassette pod on the loadport of a process machine to an OHT system that does not have the drawbacks or shortcomings of the conventional methods.

It is another object of the present invention to provide a method for aligning a cassette pod on the loadport of a process machine to an OHT system without using laser alignment equipment.

It is a further object of the present invention to provide a method for aligning a cassette pod on the loadport of a process machine to an OHT system by utilizing a simple mechanical alignment device.

It is another further object of the present invention to provide a method for aligning a cassette pod on the loadport of a process machine to an OHT system by using at least one plumb bob.

It is still another object of the present invention to provide a method for aligning a cassette pod on the loadport of a process machine to an OHT system by first marking a standard reference line on a clean room floor and then aligning the pod by using two plumb bobs that are spaced-apart by at least 5 cm.

SUMMARY OF THE INVENTION

In accordance with the present invention, a method for aligning a cassette pod on the loadport of a process machine to an overhead hoist transport system is provided.

In a preferred embodiment, a method for aligning a cassette pod on the loadport of a process machine to an OHT system can be carried out by the steps of marking a first standard reference line on a floor to which the OHT system is aligned; aligning two plumb bobs at two points that are at least 5 cm apart to the first standard reference line on the floor with tips of the two plumb bobs suspended over and juxtaposed to the floor; marking a second standard reference line by interconnecting the two plumb bobs at an elevation above the cassette pod; and aligning a center line of the cassette pod to the second standard reference line.

The method for aligning a cassette pod on the loadport of a process machine to an overhead hoist transport system may further include the step of providing the two plumb bobs that are connected by a string, or the step of marking the second standard reference line by the string. The method may further include the step of marking the second standard reference line at an elevation above and juxtaposed to a top surface of the cassette pod, or the step of marking two center lines perpendicular to and intersecting each other on a top surface of the cassette pod and forming a center point. The method may further include the step of aligning the center point to the second standard reference line, or the step of aligning two plumb bobs at two points that are at least 10 cm apart, or the step of aligning two plumb bobs at two points that are apart by a distance that is at least a width of the process machine. The method may further include the step of marking the first standard reference line on a raised floor panel situated in a clean room, or the step of providing the cassette pod in a front opening unified pod or FOUP.

The present invention is further directed to a method for aligning a cassette pod on the loadport of a process machine to an overhead hoist transport system which can be carried out by the steps of marking a first standard reference line on a floor to which the OHT system is aligned; providing two plumb bobs that are interconnected by a string, each at one of the two free ends of the string; aligning the two plumb bobs at two points that are at least 5 cm apart to the first standard reference line on the floor with tips of the two plumb bobs suspended over and positioned juxtaposed to the floor and with the string positioned over the cassette pod; marking a second standard reference line along the string; and aligning a center line of the cassette pod to the second standard reference line.

The method for aligning a cassette pod on the loadport of a process machine to an OHT system may further include the step of marking the second standard reference line at an elevation above and juxtaposed to a top surface of the cassette pod, or the step of marking two center lines perpendicular to and intersecting each other on a top surface of the cassette pod and forming a center point, or the step of aligning the center point to the second standard reference line. The method may further include the step of aligning the two plumb bobs at two points that are at least 10 cm apart, or the step of aligning the two plumb bobs at two points that are apart by a distance that is at least a width of the process machine. The method may further include the step of marking the first standard reference line on a raised floor panel situated in a clean room, or the step of providing the cassette pod in a front opening unified pod or FOUP.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for aligning a cassette pod on the loadport of a process machine to an overhead hoist transport system.

The method can be carried out by first marking a standard reference line on a clean room floor to which an OHT system is aligned, followed by aligning two plumb bobs at two points that are at least 5 cm apart, and preferably at least 10 cm apart to the standard reference line on the floor by aligning the tips of the to two plumb bobs suspended over the floor to the standard reference line. A second standard reference line is then marked by interconnecting the two plumb bobs at an elevation above a top surface of the cassette pod before executing the final step of aligning a center line of the cassette pod to the second standard reference line.

The method may further be carried out by providing two plumb bobs that are interconnected by a string, each plumb bob at one of the two free ends of the string before the plumb bobs are aligned to the standard reference line on the clean room floor.

The present invention novel method provides the significant benefit of not requiring the use of a laser alignment system which would disturb the operation of other process machines that are in the intra-bay. The present invention method further provides a method for aligning cassette pods by using simple mechanical equipment of plumb bobs. The method is capable of aligning all the cassette pods, such as FOUPs in a straight line in the same OHT intra-bay without using expensive and difficult to operate laser alignment systems. It is particularly suitable for aligning FOUPs or any other cassette pods in a production facility with the other process machines in the same OHT intra-bay in operation.

Figure 1:
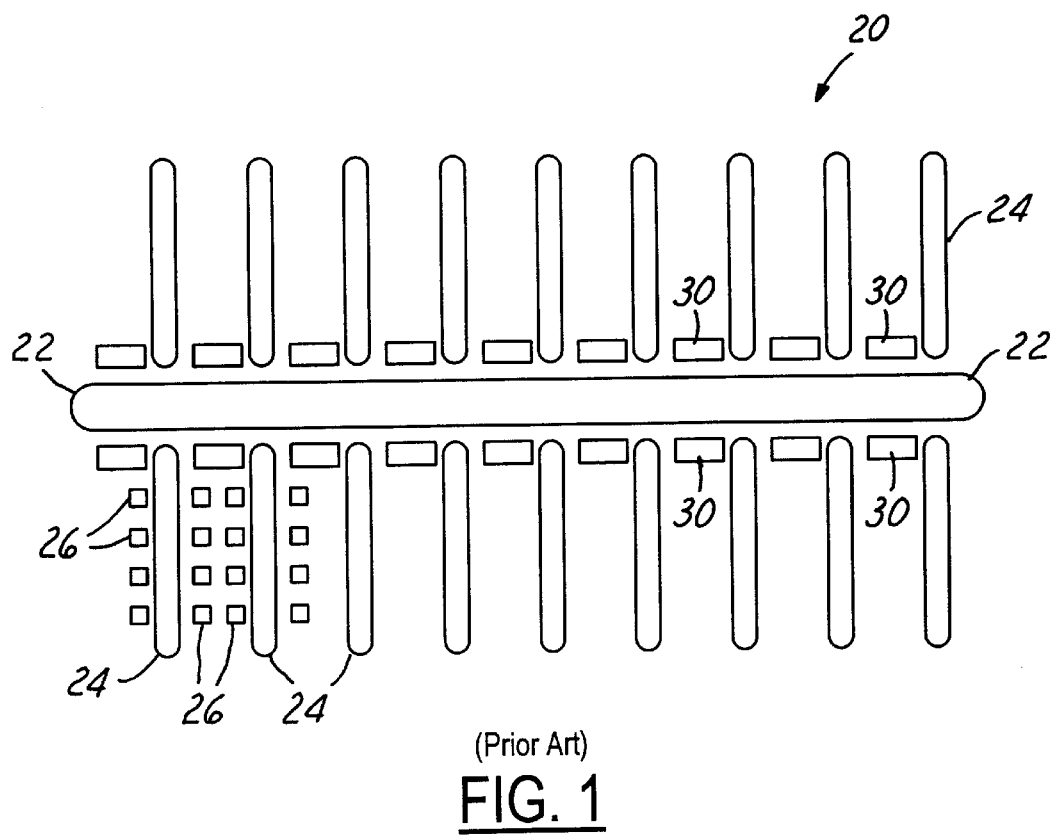
FIG. 1 is a schematic illustrating a conventional automatic material handling system utilizing a central corridor for intra-bay transport.
Figure 2:
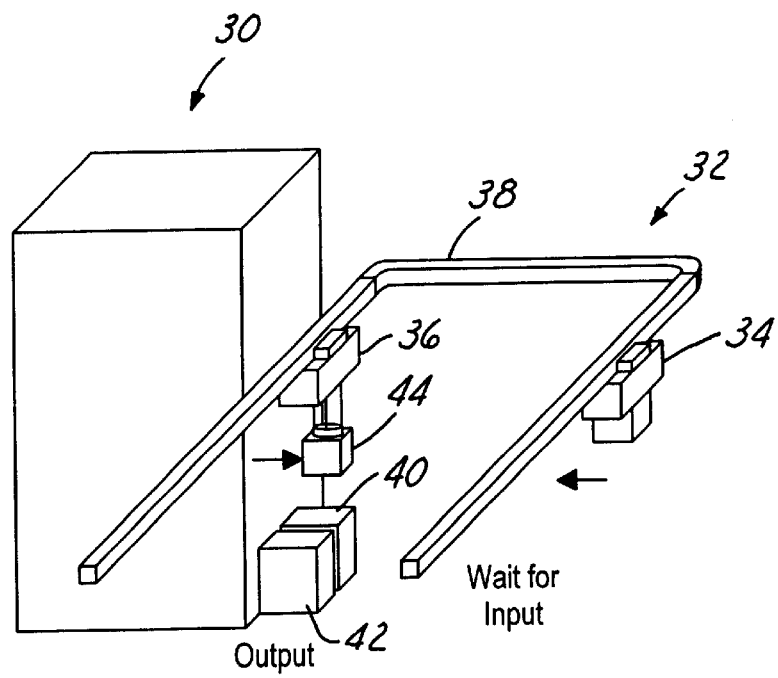
FIG. 2 is a schematic illustrating a conventional overhead hoist transport system for accessing a stocker.
Figure 3:
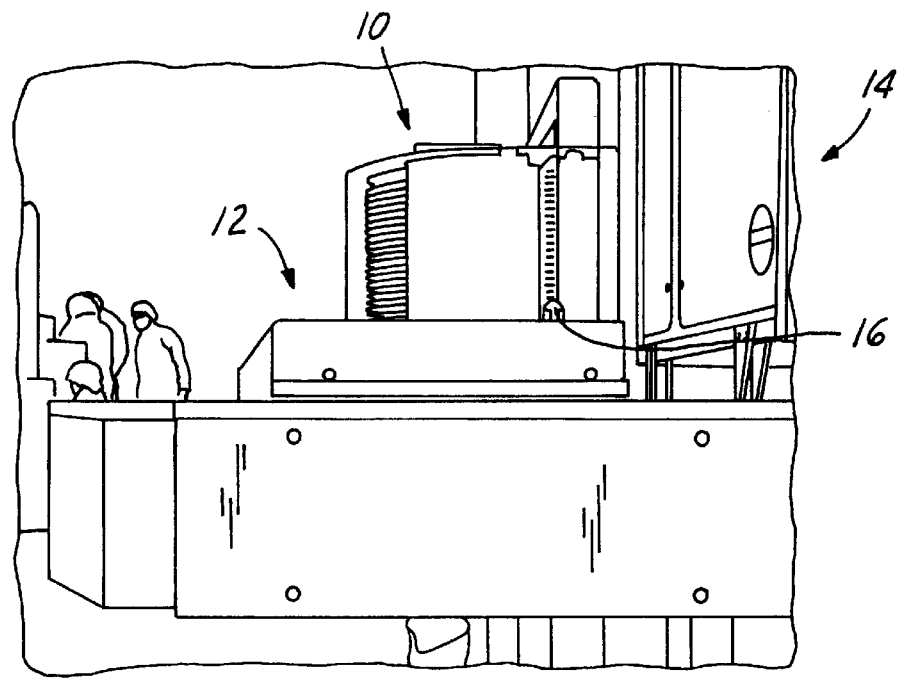
FIG. 3 is a graph illustrating a cassette pod positioned on a loadport of a process machine.
Figure 4:
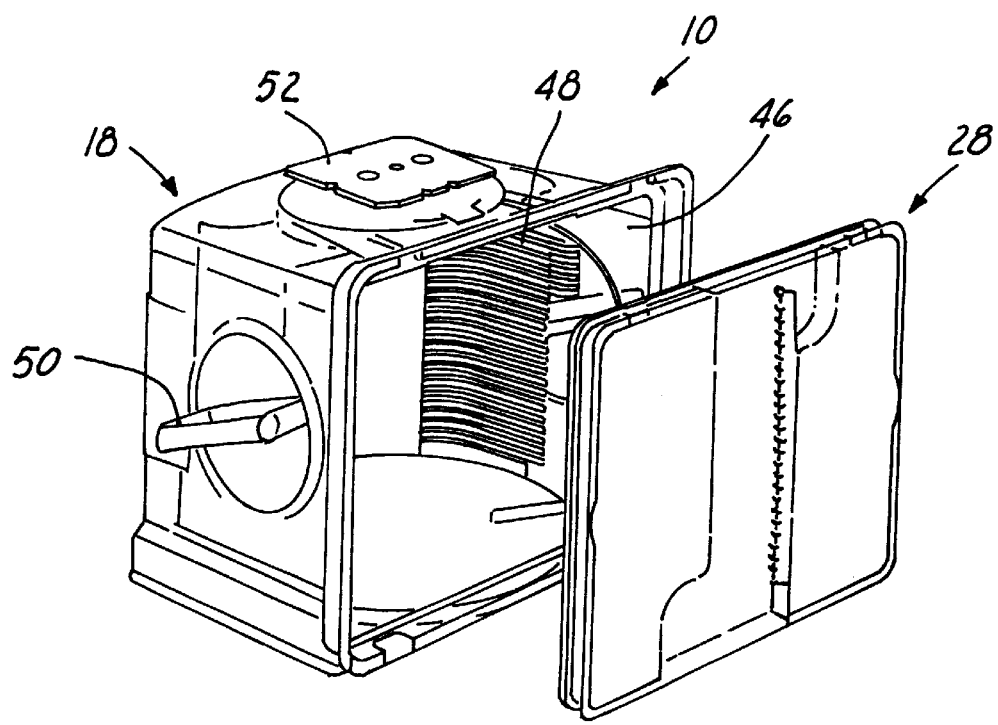
FIG. 4 is a perspective view of a front opening unified pod (FOUP).
Figure 5:
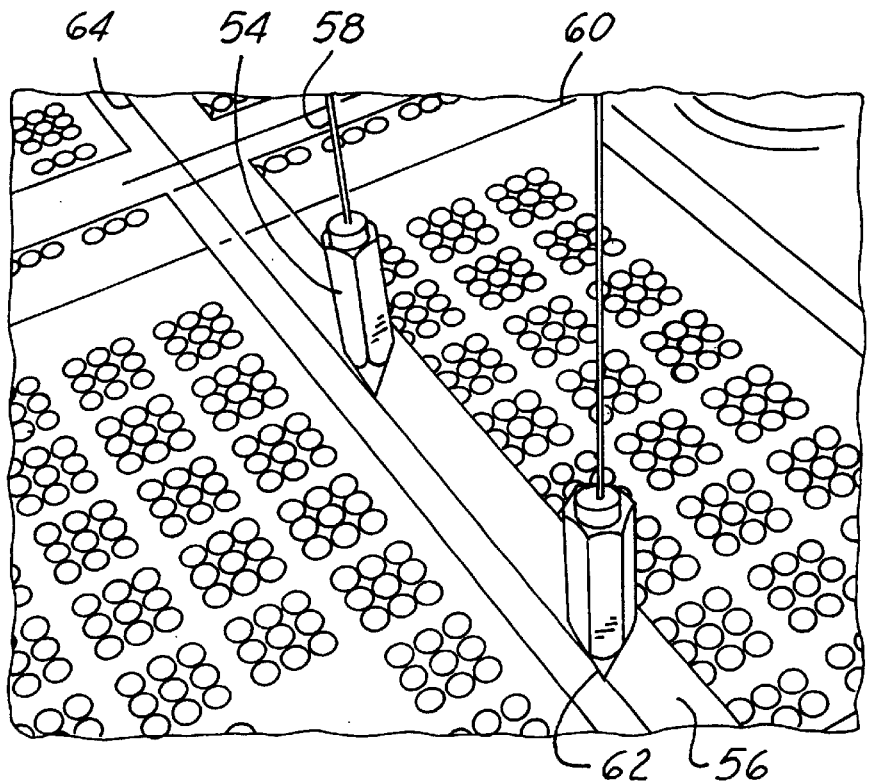
FIG. 5 is an illustration of the plumb bobs aligning with a standard reference line on a clean room floor.

Referring now to FIG. 5, wherein the present invention plumb bobs 54,56 are each suspended by strings 58,60. The tips 62 of the plumb bobs 54,56 are aligned with a standard reference line 64 that is previously scribed on the clean room floor. The method for scribing the standard reference line 64 can be carried out by any suitable method, such as by laser scribing. The clean room floor of the raised floor system is normally fabricated of aluminum and thus is easy to scribe.

Figure 6:
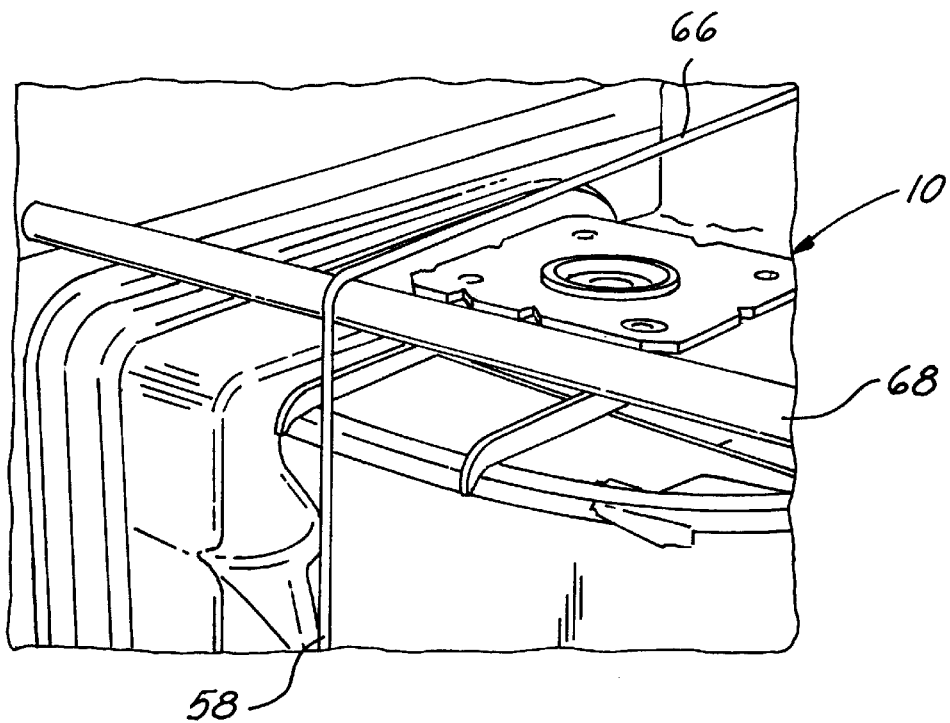
FIG. 6 is a perspective view of the present invention method in aligning a cassette pod with a standard reference line formed by two plumb bobs.

The upper ends of the strings 58,60 may be connected, as shown in FIG. 6, in a straight line portion 66 and is supported by a frame structure 68 suspended over the cassette pod 10. It should be noted that only one side of the support frame 68 is shown in FIG. 6 which is suspended on one side of the cassette pod 10. The other side of the frame structure 68 is not shown.

Figure 7:
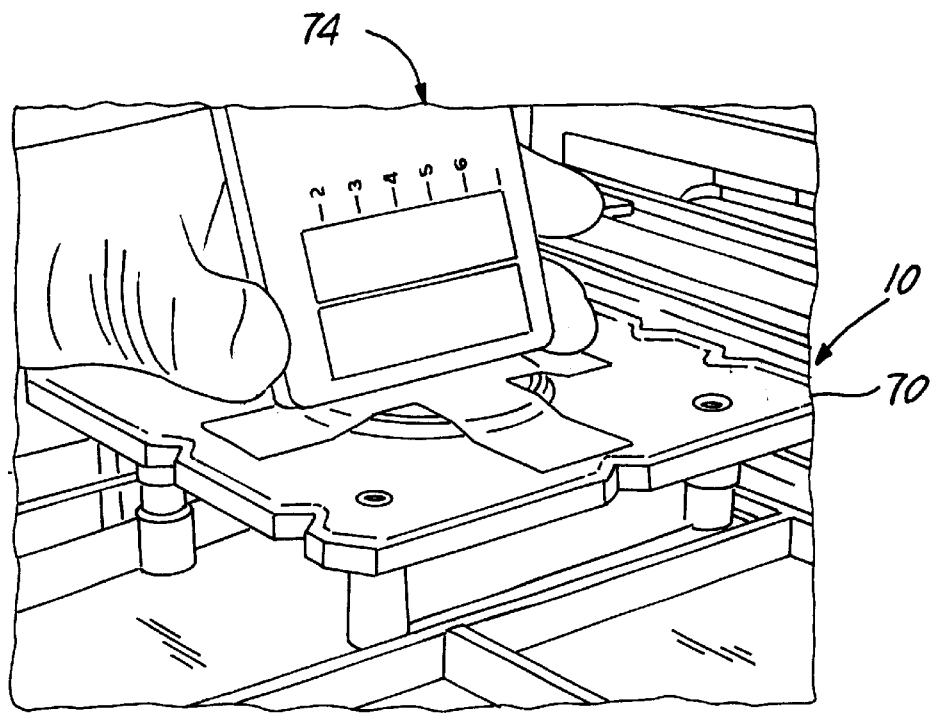
FIG. 7 is an illustration of two perpendicular center lines formed on top of a cassette pod for alignment.

Prior to the alignment procedure for the cassette pod, or for the FOUP, two center lines that are perpendicular and intersects each other may be first provided on a top surface 70 of the cassette pod 10. As shown in FIG. 7, the center lines 72 are first drawn on tapes that are adhesively placed on top of the surface 70 of the FOUP 10. The center lines 72 may be drawn by any suitable equipment, for instance, by a calibration block 74 shown in FIG. 7.

Figure 8:
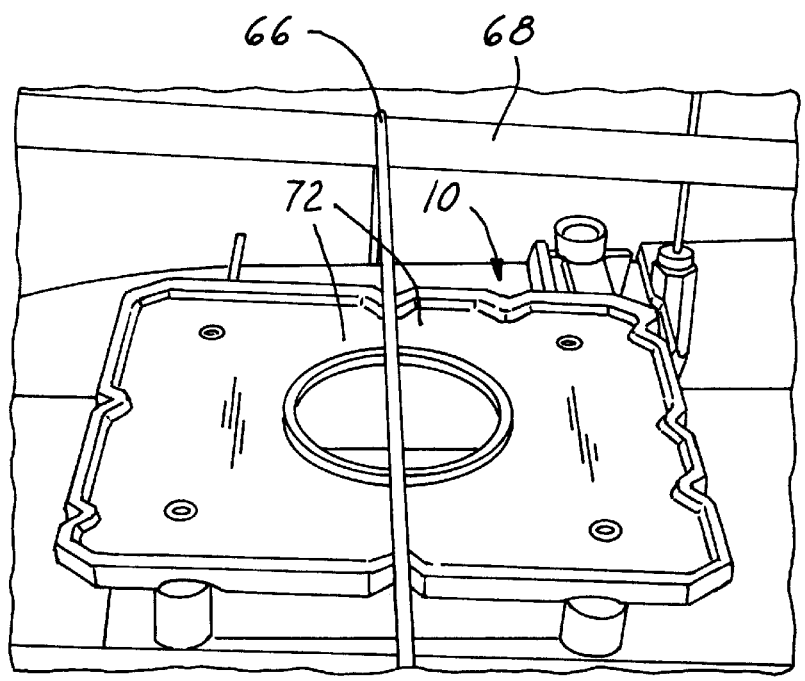
FIG. 8 is a perspective view of a cassette pod that is aligned with a standard reference line formed by the present invention plumb bobs.

FIG. 8 is a perspective view of the second standard reference line, i.e. the string 66 formed by the two plumb bobs 54,56. The string 66 overlaps center line 72 in the transverse direction. After the cassette pod 10 is aligned, the plumb bobs 54,56 and the string 66 may be removed and used for aligning the next cassette pod on the next process machine. The present invention novel method therefore utilizes simple mechanical equipment that can be easily portable and moved around in a production facility for aligning any cassette pod on any process machine.

During the alignment process, the two plumb bobs 54,56 should be positioned at least 5 cm apart, and preferably at least 10 cm apart, or more preferably at a distance apart that is at least the width of the process machine so that string 66 bridges over the machine.

The present invention novel method for aligning a cassette pod on the loadport of a process machine to an overhead hoist transport system has therefore been amply described in the above description and in the appended drawings of FIGS. 5–8.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for aligning a cassette pod on the loadport of a process machine to an overhead hoist transport (OHT) system comprising the steps of:

marking a first standard reference line on a floor to which said OHT system is aligned;

aligning two plumb bobs at two points that are at least 5 cm apart to said first standard reference line on said floor with tips of said two plumb bobs suspended over and juxtaposed to said floor;

marking a second standard reference line by interconnecting said two plumb bobs at an elevation above said cassette pod; and aligning a center line of said cassette pod to said second standard reference line.

2. A method for aligning a cassette pod on the loadport of a process machine to an overhead hoist transport system according to claim 1 further comprising the step of providing said two plumb bobs that are connected by a string.

3. A method for aligning a cassette pod on the loadport of a process machine to an overhead hoist transport system according to claim 1 further comprising the step of marking said second standard reference line at an elevation above and juxtaposed to a top surface of said cassette pod.

4. A method for aligning a cassette pod on the loadport of a process machine to an overhead hoist transport system according to claim 1 further comprising the step of marking two center lines perpendicular to and intersecting each other on a top surface of said cassette pod and forming a center point.

5. A method for aligning a cassette pod on the loadport of a process machine to an overhead hoist transport system according to claim 4 further comprising the step of aligning said center point to said second standard reference line.

6. A method for aligning a cassette pod on the loadport of a process machine to an overhead hoist transport system according to claim 1 further comprising the step of aligning two plumb bobs at two points that are at least 10 cm apart.

7. A method for aligning a cassette pod on the loadport of a process machine to an overhead hoist transport system according to claim 1 further comprising the step of aligning two plumb bobs at two points that are apart by a distance that is at least a width of said process machine.

8. A method for aligning a cassette pod on the loadport of a process machine to an overhead hoist transport system according to claim 1 further comprising the step of marking said first standard reference line on a raised floor panel situated in a clean room.

9. A method for aligning a cassette pod on the loadport of a process machine to an overhead hoist transport system according to claim 1 further comprising the step of providing said cassette pod in a front opening unified pod (FOUP).

10. A method for aligning a cassette pod on the loadport of a process machine to an overhead hoist transport (OHT) system comprising the steps of:
   marking a first standard reference line on a floor to which said OHT system is aligned;
   providing two plumb bobs that are interconnected by a string, each at one of the two free ends of the string;
   aligning said two plumb bobs at two points that are at least 5 cm apart to said first standard reference line on said floor with tips of said two plumb bobs suspended over and positioned juxtaposed to said floor and with said string positioned over said cassette pod;
   marking a second standard reference line along said string; and
   aligning a center line of said cassette pod to said second standard reference line.

11. A method for aligning a cassette pod on the loadport of a process machine to an overhead hoist transport system according to claim 10 further comprising the step of marking said second standard reference line at an elevation above and juxtaposed to a top surface of said cassette pod.

12. A method for aligning a cassette pod on the loadport of a process machine to an overhead hoist transport system according to claim 10 further comprising the step of marking two center lines perpendicular to and intersecting each other on a top surface of said cassette pod and forming a center point.

13. A method for aligning a cassette pod on the loadport of a process machine to an overhead hoist transport system according to claim 12 further comprising the step of aligning said center point to said second standard reference line.

14. A method for aligning a cassette pod on the loadport of a process machine to an overhead hoist transport system according to claim 10 further comprising the step of aligning said two plumb bobs at two points that are at least 10 cm apart.

15. A method for aligning a cassette pod on the loadport of a process machine to an overhead hoist transport system according to claim 10 further comprising the step of aligning said two plumb bobs at two points that are apart by a distance that is at least a width of said process machine.

16. A method for aligning a cassette pod on the loadport of a process machine to an overhead hoist transport system according to claim 10 further comprising the step of marking said first standard reference line on a raised floor panel situated in a clean room.

17. A method for aligning a cassette pod on the loadport of a press machine to an overhead hoist transport system according to claim 10 further comprising the step of providing said cassette pod in a front opening unified pod (FOUP).

* * * * *